United States Patent [19]

Casper

[11] Patent Number: 5,066,999

[45] Date of Patent: Nov. 19, 1991

[54] RESISTOR UNDER WIREBOND PAD

[75] Inventor: Stephen L. Casper, Boise, Id.

[73] Assignee: Micron Technology, Inc., Boise, Id.

[21] Appl. No.: 425,675

[22] Filed: Oct. 23, 1989

[51] Int. Cl.$^5$ .......................................... H01L 27/02
[52] U.S. Cl. ........................................ 357/51; 357/71;
357/23.13
[58] Field of Search ...................... 357/51, 71, 23.13

[56] References Cited

U.S. PATENT DOCUMENTS

| | | | |
|---|---|---|---|
| 4,695,870 | 9/1987 | Patraw | 357/56 |
| 4,710,791 | 12/1987 | Shirato et al. | 357/23.13 |
| 4,771,294 | 9/1988 | Wasilousky | 357/81 |
| 4,807,080 | 2/1989 | Clark | 357/23.13 |
| 4,819,046 | 4/1989 | Misy | 357/23.13 |
| 4,876,584 | 10/1989 | Taylor | 357/68 |
| 4,881,106 | 11/1989 | Barron | 357/23.13 |
| 4,896,243 | 1/1990 | Chattorjoo | 357/51 |

Primary Examiner—Eugene R. Laroche
Assistant Examiner—R. Ratliff
Attorney, Agent, or Firm—Stanley N. Protigal

[57] ABSTRACT

A preferred embodiment of the invention is a poly input resistor located underneath, rather than alongside, an IC wirebond pad. This offers the advantages of a more efficient layout, more contacts connecting the pad to the resistor, a better contact configuration, and a larger, higher current resistor.

12 Claims, 3 Drawing Sheets

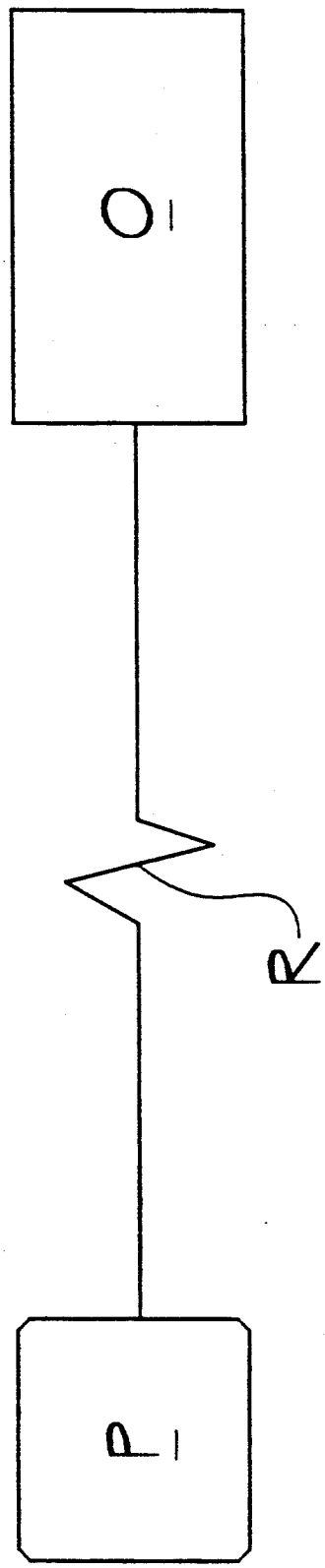

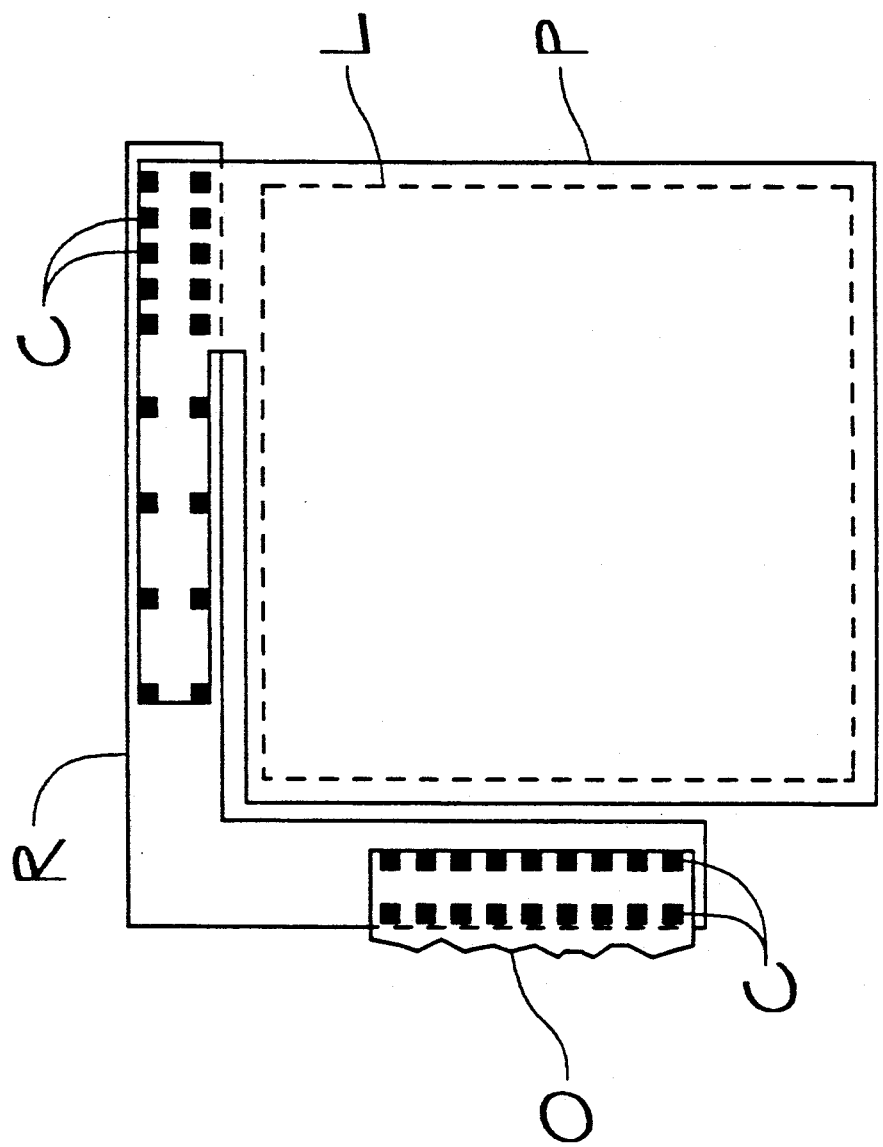
FIG. 2 – PRIOR ART

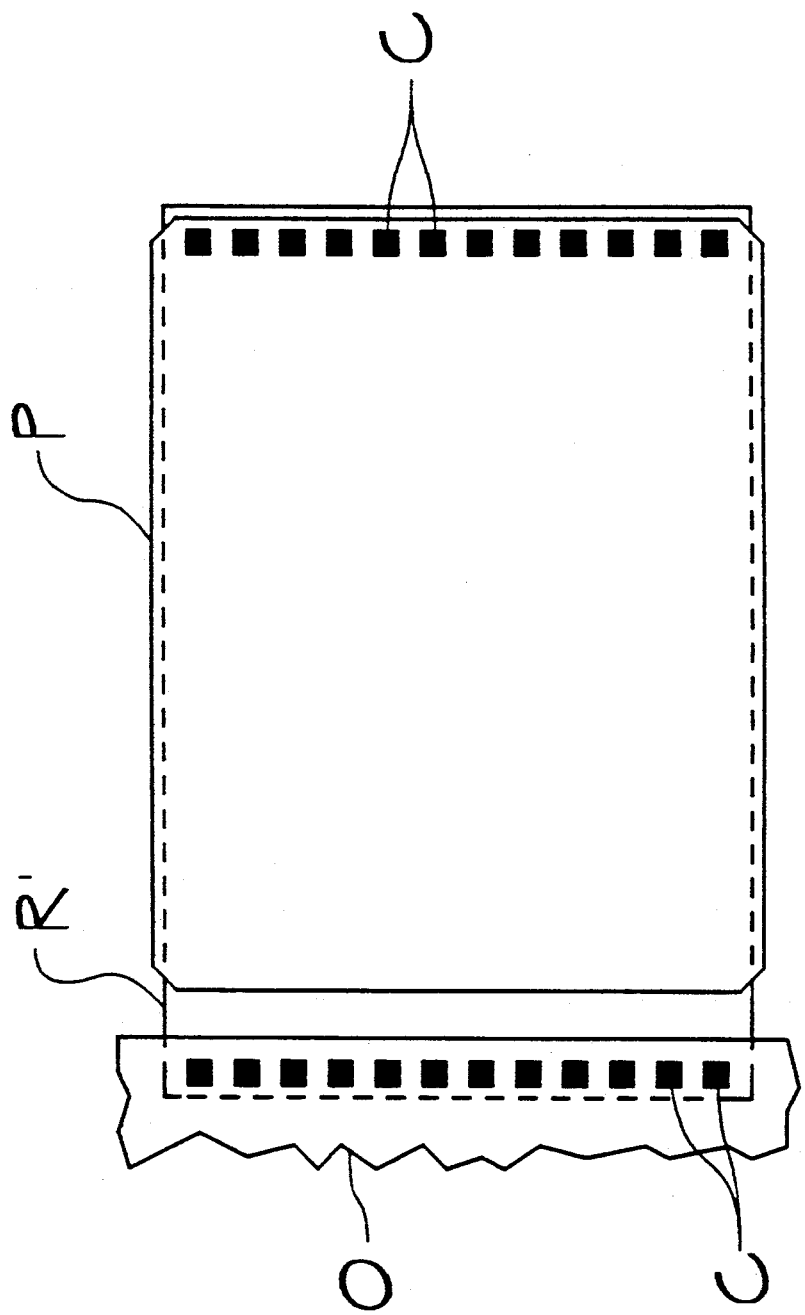

RESISTOR UNDER WIREBOND PAD

BACKGROUND OF THE INVENTION

1. Field of the Invention

This invention generally relates to layout of integrated circuits (ICs), particularly resistor configuration.

2. Description of the Related Art

An electronic circuit is chemically and physically integrated into a substrate such as a silicon wafer by patterning regions in the substrate, and by patterning layers on the substrate. These regions and layers can be conductive, for conductor and resistor fabrication. They can also be of differing conductivity types, which is essential for transistor and diode fabrication. Degrees of resistance, capacitance, or conductivity are controllable, as are the physical dimensions and locations of the patterned regions and layers, making circuit integration possible.

In this disclosure, "n" denotes silicon that has been doped with atoms having more than four valence electrons (group V or higher), such as arsenic, which introduce negatively charged majority carriers into the silicon, and "p" denotes silicon doped with atoms having less than four valence electrons (group III or lower), such as boron or phosphorus, which introduce positively charged majority carriers. The majority charge carrier type is also referred to as conductivity type. A plus or minus superscript on an n or p indicates heavy or light doping, respectively. "Poly" denotes polycrystalline silicon, which is often used for resistor fabrication. Geometries and doping directly affect poly resistivity.

As illustrated in FIG. a typical IC input includes resistor R, which is usually configured as a poly layer adjacent to wirebond pad P as shown in FIG. 2. R and P are connected through contacts C. Typically, pad P rests on a layer of poly L which prevents short circuiting to substrate if pad P is punctured during wafer sort or assembly. R is also connected to other circuitry O in the IC. O generally will include input protection circuitry.

SUMMARY OF THE INVENTION

A preferred embodiment of the invention is a poly input resistor located underneath, rather than alongside, an IC wirebond pad. This offers the advantages of a more efficient layout, more contacts connecting the pad to the resistor, a better contact configuration, and a larger, higher current resistor.

BRIEF DESCRIPTION OF THE DRAWINGS

FIG. 1 is a schematic of typical IC input circuitry.
FIG. 2 shows a prior art input resistor layout.
FIG. 3 shows an input resistor configured according to the invention.

DETAILED DESCRIPTION OF THE PREFERRED EMBODIMENT

A preferred embodiment of the invention is shown in FIG. 3. Poly resistor R' rests underneath wirebond pad P, and connects P to other circuitry O via contacts C. Protective poly is still placed under pad P, but additionally serves as a resistor. Given this drawing, the device is easily constructed by one of ordinary skill in semiconductor fabrication by a number of methods, none of which are deemed necessary to disclose herein.

This embodiment allows contacts C to be arranged in a line perpendicular to the path of current flow in R'. This is superior to the prior art contact C arrangement shown in FIG. 2, because current is evenly distributed among contacts. R' clearly can be made larger without sacrificing area surrounding pad P.

In an alternate embodiment, R' includes an n well rather than a layer of poly. This is useful where very high resistances are desired. The layout of this embodiment appears the same as the preferred embodiment in FIG. 3.

What is claimed is:

1. IC apparatus comprising:
   (a) a semiconductor substrate, having active circuitry formed thereon;
   (b) a resistor including a layer of polysilicon disposed over said substrate;
   (c) a wirebond pad, said wirebond pad being remote from said active circuitry;
   (d) a first group of contacts, contacting said wirebond pad to said resistor; and
   (e) a second group of contacts, contacting said resistor to other circuitry located on said substrate;
   wherein said wirebond pad is disposed over a portion of said resistor.

2. The apparatus of claim 1, wherein said polysilicon is doped to a predetermined level.

3. The apparatus of claim 1, wherein said first and second groups of contacts are each arranged in a line perpendicular to a direction of current flow in said resistor, and said first group of contacts is located near an edge of said wirebond pad.

4. IC apparatus comprising:
   (a) a semiconductor substrate of a first conductivity type;
   (b) a resistor including a well of a second conductivity type in said substrate;
   (c) a wirebond pad;
   (d) a first group of contacts, contacting said wirebond pad to said resistor; and
   (e) a second group of contacts, contacting said resistor to other circuitry located on said substrate;
   wherein said wirebond pad is disposed over a portion of said resistor.

5. The apparatus of claim 4, wherein said first conductivity type is p and said second conductivity type is n.

6. The apparatus of claim 4, wherein said first and second groups of contacts are each arranged in a line perpendicular to a direction of current flow in said resistor, and said first group of contacts is located near an edge of said wirebond pad.

7. IC apparatus comprising:
   (a) a semiconductor substrate, having active circuitry formed thereon;
   (b) a resistor including a layer of polysilicon disposed over said substrate;
   (c) a wirebond pad, said wirebond pad being remote from said active circuitry;
   (d) a first group of contacts, contacting said wirebond pad to said resistor; and
   (e) a second group of contacts, contacting said resistor to other circuitry located on said substrate;
   wherein said wirebond pad is substantially disposed over said resistor.

8. The apparatus of claim 7, wherein said polysilicon is doped to a predetermined level.

9. The apparatus of claim 7, wherein said first and second groups of contacts are each arranged in a line perpendicular to a direction of current flow in said resistor, and said first group of contacts is located near an edge of said wirebond pad.

10. IC apparatus comprising:
   (a) a semiconductor substrate of a first conductivity type, said substrate having active circuitry formed thereon;
   (b) a resistor including a well of a second conductivity type in said substrate;
   (c) a wirebond pad, said wirebond pad being remote from said active circuitry;
   (d) a first group of contacts, contacting said wirebond pad to said resistor; and
   (e) a second group of contacts, contacting said resistor to other circuitry located on said substrate;
   wherein said wirebond pad is substantially disposed over said resistor.

11. The apparatus of claim 10, wherein said first conductivity type is p and said second conductivity type is n.

12. The apparatus of claim 10, wherein said first and second groups of contacts are each arranged in a line perpendicular to a direction of current flow in said resistor, and said first group of contacts is located near an edge of said wirebond pad.

* * * * *